US005442192A

United States Patent [19]

Goronkin et al.

[11] Patent Number: 5,442,192

[45] Date of Patent: Aug. 15, 1995

[54] HETEROSTRUCTURE ELECTRON EMITTER UTILIZING A QUANTUM WELL

[75] Inventors: Herbert Goronkin, Tempe; Lawrence N. Dworsky, Scottsdale, both of Ariz.

[73] Assignee: Motorola, Schaumburg, Ill.

[21] Appl. No.: 187,258

[22] Filed: Jan. 27, 1994

[51] Int. Cl.$^6$ .................... H01L 27/14; H01L 29/161

[52] U.S. Cl. ........................................ 257/10; 257/14; 257/29; 257/245; 257/254

[58] Field of Search ........................ 257/10, 12, 18, 22, 257/183.1, 245, 254, 14, 29

[56] References Cited

U.S. PATENT DOCUMENTS 4,893,161 1/1990 Tanski et al. ........................ 257/245
5,159,420 10/1992 Grudkowski et al. ................ 257/14
5,264,717 11/1993 Grudkowski et al. ................ 257/24
5,283,444 2/1994 Sacks et al. ........................... 257/21
5,285,079 2/1994 Tsukamoto et al. .................. 257/10

*Primary Examiner*—Mahshid D. Saadat
*Attorney, Agent, or Firm*—Eugene A. Parsons

[57] ABSTRACT

A heterostructure electron emitter including a substrate having a surface with a predetermined potential barrier and a quantum well formed in the substrate adjacent the surface. Contacts are positioned on the substrate for coupling free electrons to the substrate and into the quantum well. An acoustic wave device is positioned on the substrate so as to direct acoustic waves to strike the free electrons in the quantum well and excite the free electrons sufficiently to cause the free electrons to overcome the potential barrier and to be emitted from the surface of the substrate.

9 Claims, 2 Drawing Sheets

FIG. 4
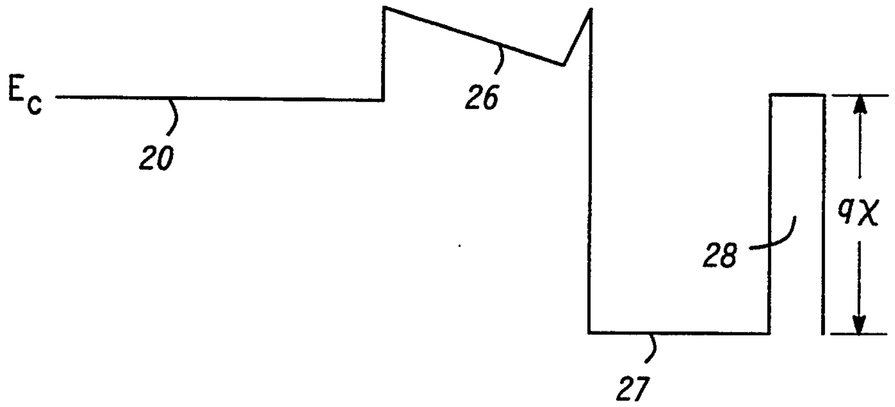
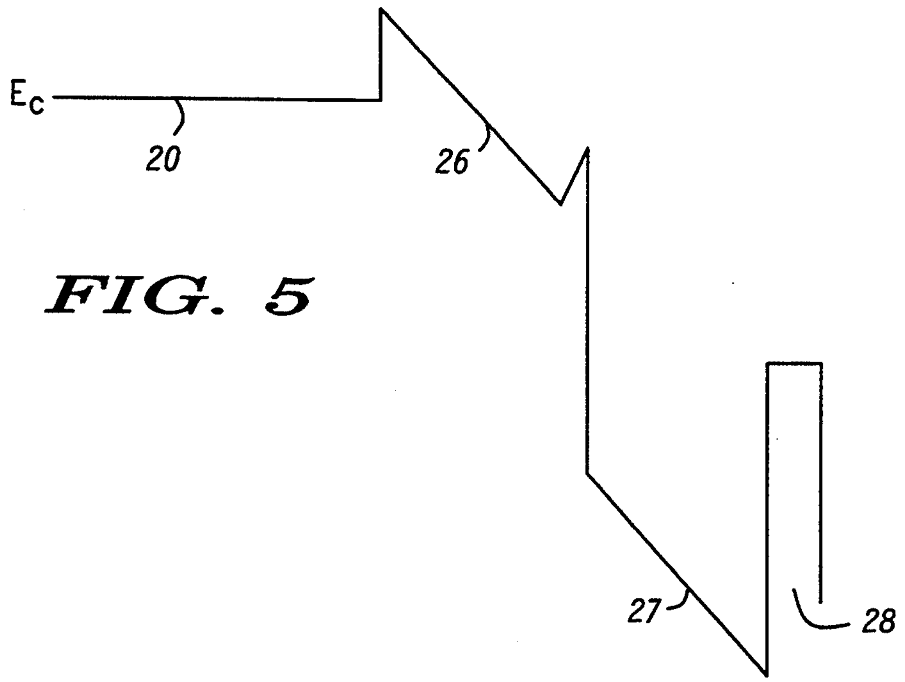
FIG. 5
FIG. 6
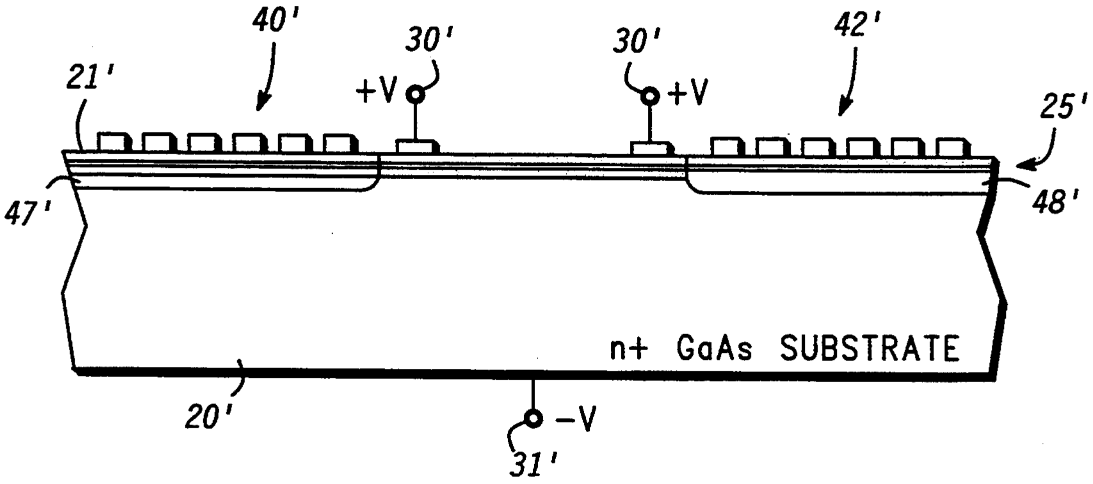

HETEROSTRUCTURE ELECTRON EMITTER UTILIZING A QUANTUM WELL

FIELD OF THE INVENTION

The present invention pertains to emitters for emitting free electrons into space and more particularly to low voltage room temperature electron emitters

BACKGROUND OF THE INVENTION

Many schemes have been developed for emitting free electrons into space, or a vacuum. The classic, and very early, electron emitter includes a cathode and a heater positioned adjacent to the cathode for heating the cathode sufficiently to cause electrons to be emitted. Typical examples of this type of electron emission can be seen in cathode ray tubes (CRTs) and all of the vacuum tubes previously used in electronic equipment. This structure and process is unwieldy because it requires a large amount of power to heat the cathode. Also, the heat from the heater has a tendency to cause damage in other adjacent components so that other components must be spaced from the structure. Further, an additional power supply, other than the one supplying the flow of electrons, is generally required for the heater. This adds additional cost as well as the space required.

Other apparatus for emitting electrons include devices called field emission devices (FEDs) which generally require relatively large voltages to cause the electrons to be emitted from a sharp tip of metal. In some applications the sharp tip is coated with a material. Such as cesium or diamond, to reduce the potential barrier at the surface of the emitter. In some of these devices the voltages required are reduced somewhat.

In yet another apparatus and method for emitting free electrons into space the photoelectron phenomenon is utilized. In this method and/or apparatus, electrons in a material that is bombarded with photons gain sufficient energy to thereby overcome a potential barrier of the emitting material. This procedure does not produce convenient apparatus since it is difficult to sufficiently raise the density of the photons.

Devices for emitting electrons into space are used in displays of all types, and can be used to replace vacuum tubes and/or transistors and the like in certain applications. It is, therefore, desirable to provide electron emitters which are convenient to use, require low voltages and operate at approximately room temperature.

It is a purpose of the present invention to provide a new and improved electron emitter.

It is a further purpose of the present invention to provide a new and improved electron emitter which operates on relatively low potentials.

It is another purpose of the present invention to provide a new and improved electron emitter which operates at room temperatures.

It is still another purpose of the present invention to provide a new and improved electron emitter which is not extremely bulky or difficult to manufacture and which, therefore, is less expensive in terms of space and fabrication techniques.

SUMMARY OF THE INVENTION

The above described problems and others are substantially solved and the above described purposes and others are realized in a heterostructure electron emitter including a substrate having a surface with a predetermined potential barrier and a quantum well formed in the substrate adjacent the surface. Contacts are positioned on the substrate for coupling free electrons to the substrate and into the quantum well. An acoustic wave device is positioned on the substrate so as to direct acoustic waves to strike the free electrons in the quantum well and excite the free electrons sufficiently to cause the free electrons to overcome the potential barrier and to be emitted from the surface of the substrate.

The above described problems and others are substantially solved and the above described purposes and others are further realized in a method of emitting electrons from an electron source including the steps of providing a substrate having a surface with a predetermined potential barrier and forming a quantum well in the substrate adjacent the surface, providing contacts on the substrate for coupling free electrons to the substrate and into the quantum well, and forming an acoustic wave device on the substrate positioned to direct acoustic waves to strike the free electrons in the quantum well and excite the free electrons sufficiently to cause the free electrons to overcome the potential barrier and to be emitted from the surface of the substrate.

BRIEF DESCRIPTION OF THE DRAWINGS

Referring to the drawings:

FIG. 4 is an energy diagram of the structure of FIG. 2 in an unbiased mode;

FIG. 5 is an energy diagram of the structure of FIG. 2 in a biased mode; and FIG. 6 is view similar to FIG. 2 of another embodiment.

DESCRIPTION OF THE PREFERRED EMBODIMENTS

Figure 1:
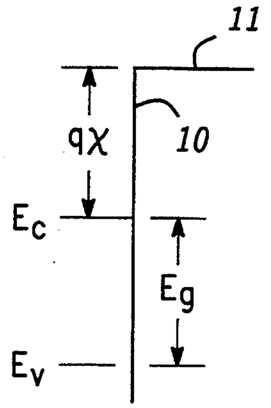
FIG. 1 is an energy diagram of a typical semiconductor to vacuum surface energy barrier.

Referring now to FIG. 1 there is shown an energy diagram illustrating an energy barrier 10 for a semiconductor to vacuum interface. The semiconductor material surface characteristic is detailed as an upper energy level $E_v$ of a valence band and a lower energy level of a conduction band $E_c$. A vacuum energy level 11 is shown in relation to the energy levels of the semiconductor material wherein the disposition of the vacuum energy level 11 at a higher level than that of the semiconductor energy levels indicates that energy must be provided to electrons disposed in the semiconductor material in order that such electrons may possess sufficient energy to overcome the barrier which inhibits spontaneous emission from the surface of the semiconductor material into the vacuum space.

For the semiconductor system under consideration the energy difference between the vacuum energy level $E_v$ and the lower level of the conduction band $E_c$ is referred to as the electron affinity, $q\chi$. The difference in energy levels between the lower level of the conduction band $E_c$ and the upper energy level of the valence band $E_v$ is generally referred to as the band-gap, Eg. As shown in the depiction of FIG. 1, it will be necessary to augment the energy content of an electron disposed at the lower energy level of the conduction band $E_c$ to raise it to an energy level corresponding to the free-space energy level 11. A work function or electron affinity, $q\chi$, is defined as the energy which must be added to an electron which resides at the lower energy level of the conduction band $E_C$ so that the electron may overcome the potential barrier to escape the surface of the material in which it is disposed. Typical values of $q\chi$ for III–V compounds are 4–6 eV.

Figure 2:
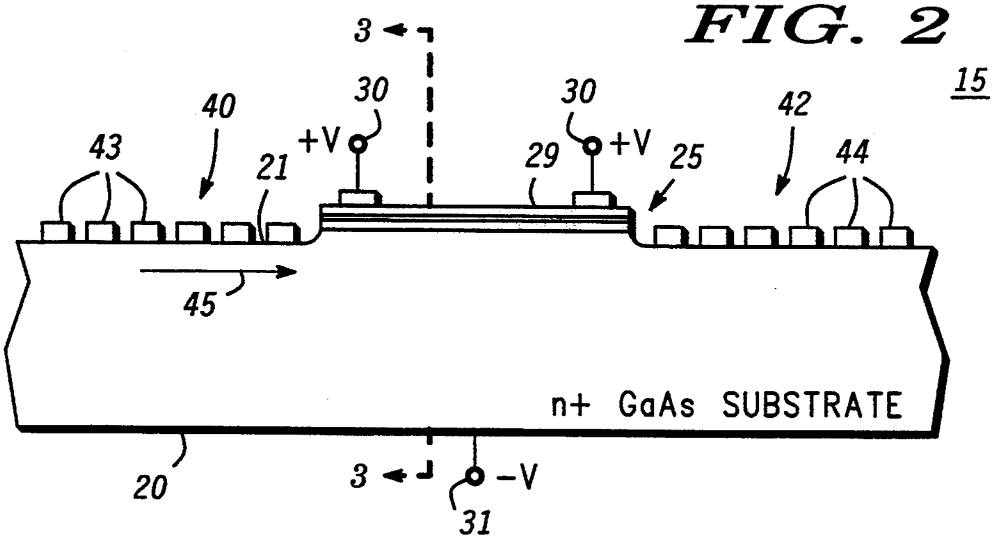
FIG. 2 is a sectional view of a heterostructure electron emitter in accordance with the present invention.

A simplified sectional view of a heterostructure electron emitter 15 in accordance with the present invention is illustrated in FIG. 2. All material layers shown in FIG. 2, are substantially single crystal epitaxially grown layers. This requires that each epitaxial layer comprise a material which is crystalographically compatible with an underlying substrate. Therefore, in addition to electronic material constraints discussed hereinafter in this explanation and in regard to the particular embodiments to be described, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

Figure 3:
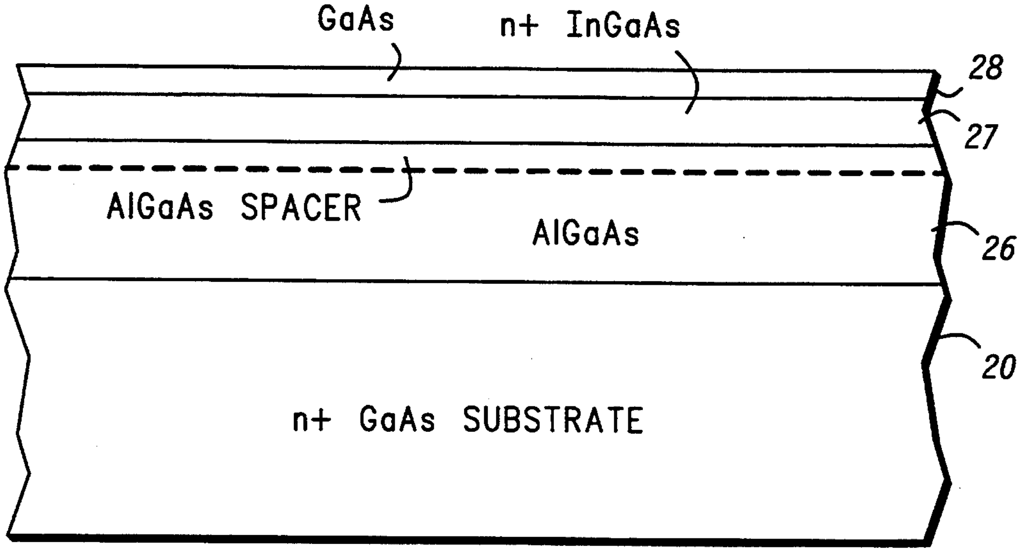
FIG. 3 is a greatly enlarged, simplified cross-sectional view as seen from the line 3—3 in FIG. 2.

Electron emitter 15 includes a substrate 20 comprised of some convenient material, such as n+ gallium arsenide (GaAs), and having a planar surface 21. Substrate 20 has selectively positioned thereon a plurality of heterostructure layers 25 of semiconductor material which form a quantum well, as will be explained presently. A greatly enlarged cross-sectional view of heterostructure layers 25, as seen from the line 3—3 of FIG. 2, is illustrated in FIG. 3. Heterostructure layers 25 include a wide band gap buffer layer 26, a narrow bandgap layer 27, which forms a quantum well, and a barrier layer 28.

In this specific embodiment, layer 26 includes a layer of aluminum gallium arsenide (AlGaAs), which is crystallographically compatible with the GaAs substrate. Other wide band gap materials are known and may be used, but, as will be seen, AlGaAs is desirable in the described structures to ensure compatibility with other materials used in overlying layers therein. Layer 26 is approximately 130 to 250 angstroms thick with an upper portion being planar and doped with some material such as silicon to form a spacer approximately 30 to 50 angstroms thick. Narrow bandgap layer 27 includes a layer of n+ indium gallium arsenide (InGaAs) approximately 100 angstroms thick. As will be understood, the difference in bandgaps of heterostructure layers 25 results in a quantum well being formed in layer 27. The quantum well is covered by barrier layer 28, which includes a thin layer of gallium arsenide (GaAs) approximately 50 angstroms thick. In this embodiment, heterostructure layers 25 are electrically separated from surrounding portions of substrate 20 by etching the surface of substrate 20 to form surface 21 approximately below the plane of the lower surface of layer 26.

Conduction band energy ($E_C$), for heterostructure layers 25 illustrated in FIG. 3, is illustrated in an energy band diagram shown in FIG.4. In the energy band diagram of FIG. 4, the vertical axis represents relative energy in electron volts, and the horizontal axis represents thickness or depth within heterostructure layers 25 of FIG. 3. The right hand side of the drawing is the surface of heterostructure layers 25, while the left hand side of the drawing is substrate 20. The portions of the energy band diagram representing substrate 20 and each of layers 26, 27 and 28 are designated with similar numerals so that each of the layers can be correlated with the energy band diagram. As will be understood and can be seen in FIG. 4, a quantum well is formed by layer 27. Also, electron affinity qX, which is the work function, or the amount of energy required to raise the energy of electrons in the quantum well (layer 27) sufficiently to be emitted from surface 21 is illustrated.

A positive bias contact 30 is formed on the surface of heterostructure layers 25 and provides an ohmic contact with layer 28 positioned directly therebelow. Layer 28 electrically couples bias contact 30 to the quantum well and may include at least partially an extension of the quantum well, along with additional conductive material if desired or convenient. Similarly, a negative bias contact 31 forms an ohmic contact with the lower, or reverse surface, of substrate 20. Generally, a bias voltage is applied between bias contacts 30 and 31 to apply a bias to the quantum well so that electrons flow into the quantum well and are, thereby, trapped adjacent to the surface 21, or adjacent to the surface of heterostructure layers 25. The bias applied to bias contacts 30 and 31 is relatively low and is utilized only to obtain a flow of electrons into the quantum well, generally in the range of a few volts. This, as will be seen presently, provides a continuous supply of electrons for emission into free space above surface 21 or the surface of heterostructure layers 25.

In some applications it may be convenient to grow or deposit a layer (indicated by numeral 29 only for purposes of this discussion) of low electron affinity material over barrier layer 28 and provide a low affinity electron emission surface. The low affinity layer 29 can include, for example, a cesium-based material which reduces the potential barrier at the surface to approximately 1.7 eV. In some applications it may be convenient to utilize a diamond layer to reduce the potential barrier and allow low voltage emission into free space. Other materials may be utilized to reduce the surface potential barrier of emitter 15 and generally, as will be understood presently, the surface barrier for most applications should be reduced to something below approximately 2.0 eV.

Referring again to FIG. 2, an acoustic transmitter 40 is positioned on surface 21 of substrate 20 adjacent to heterostructure layers 25 and to the left in FIG. 2. An acoustic receiver 42 is positioned adjacent to heterostructure layers 25 and to the right in FIG. 2. Acoustic devices 40 and 42 can be any well known acoustic generator, including a surface acoustic wave (SAW) device, a bulk acoustic wave device, etc. In this specific embodiment, acoustic transmitter 40 includes a plurality of interdigitated fingers 43 which form a simple surface acoustic wave device. Also, acoustic receiver 42 includes a plurality of interdigitated fingers 44 which form a simple surface acoustic wave device. As is known in the art, alternate fingers 43 of acoustic transmitter 40 are connected together and to opposite sides of a source (not shown) of acoustic waves. In a well known manner the acoustic waves are then launched into substrate 20 generally at or near surface 21 and in a direction indicated by arrow 45. Similarly, fingers 44 of acoustic receiver 42 are connected to receive and provide a termination for the acoustic waves launched by acoustic transmitter 40.

Here it should be noted that heterostructure layers 25 are very thin. Therefore, depending upon the specific acoustic generator utilized, the specific thicknesses of the layers and the method of construction, heterostructure layers 25 can be positioned on surface 21 with an acoustic generator (transmitter 40 and receiver 41) positioned slightly therebelow, as illustrated in FIG. 2. Alternatively, surface 21 can be built-up slightly (not shown) by some convenient depositions so that acoustic generator 40 is in the plane of the surface of layer 26.

FIG. 6 illustrates a further embodiment in which similar components are designated with similar numbers and a prime is added to designate the different embodiment. In this embodiment, heterostructure layers 25' are formed by planar depositions across the entire surface of substrate 20'. Regions 47' and 48', which are isolation implant regions and which define the active region of heterostructure layers 25' therebetween, are then formed by some convenient implant, such as oxygen or boron. Acoustic transmitter 40' and acoustic receiver 42' are positioned on the planar surface 21' of substrate 20' in overlying relationship to regions 47' and 48', respectively, on either side of heterostructure layers 25'. In all of the embodiments disclosed, it is assumed for purposes of this disclosure that all of the components are positioned on the surface of substrate 20 and any heterostructure layers epitaxially formed on the substrate are thereafter considered to be a portion of the substrate for purposes of explanation (because they form a substantially continuous crystallographic structure). Thus, for example, electrons emitted from layer 28 are considered to be emitted from the surface of the substrate. In any structure, the heterostructure layers and acoustic generator should be positioned so that acoustic waves launched by the acoustic generator are directed to the quantum well.

Referring again to FIG. 2, by applying a bias to electron emitter 15 between bias contacts 30 and 31, the energy band diagram of FIG. 4 is altered to appear substantially as illustrated in FIG. 5. With the bias applied, electrons flow into the quantum well (layer 27) where they are confined to an area at or near the surface of heterostructure layers 25. An acoustic wave is applied to acoustic transmitter 40 which, in this specific embodiment generates a surface acoustic wave directed at heterostructure layers 25. Because the electrons are confined to the quantum well, the surface acoustic waves transfer energy to the confined electrons. The amount of energy transferred to an electron or electrons is generally sufficient to cause them to overcome the potential barrier of the surface and to be emitted into free space. It should be noted, however, that in many applications epitaxial layers of low electron affinity, e.g. cesium or diamond, can be grown on heterostructure layers 25 to reduce the potential barrier at the surface.

In general, the phonons produced by a bulk or surface wave acoustic generator provide the following energy. For example, with a 150 MHz acoustic generator and a peak amplitude of 10 Å,

| | |
|---|---|
| Particle Displacement | $u \simeq 10^{-9}\sin(10^{9}t)$ in meters |
| Particle Velocity | $v = u = \cos(10^{9}t)$ in meters/sec |
| Particle Acceleration | $a = v = -10^{9}\sin(10^{9}t)$ peak amplitude of $10^{9}$M/sec$^{2}$. |

Using the acoustic wavelength as the phonon wavelength $$q=2\pi/\lambda=2\pi f/v=10^{7}\text{cm}^{-1}.$$

If all the momentum of a phonon is transferred to an electron, q−k, $$\begin{aligned}\Delta E &= h^2q^2/2m\\ &= (1.05\times10^{-27}\text{ ergs})(10^{7}\text{ cm}^{-1})/\\ &\quad 2\times9.11\times10^{-28}\times0.067\\ &= 9\times10^{-13}\text{ erg}\\ &= 0.6\text{eV}\end{aligned}$$

The energy transferred to electrons in the quantum well by the acoustic wave is not sufficient to excite the electrons over the surface barrier if the electrons lie in the bottom of the well. Two factors work together to promote the emission process. First, the ground state of electrons in the quantum well lies above the conduction band edge due to quantum confinement and small electron effective mass. Second, electrons emitted into the quantum well over the planar doped barrier have energies that lie above the surface barrier. Many of the electrons in the quantum well lose energy by emitting optical phonons before reaching the surface barrier. The acoustic wave replaces some of the lost energy and causes the number of electrons emitted over the surface barrier to increase.

Thus, it can be seen that a phonon produced by acoustic generator 40 striking an electron in the quantum well of heterostructure layers 25 boosts the energy of the electron sufficiently to cause the electron to be emitted from the surface of heterostructure layers 25 into free space. It should be noted that essentially the effective temperature of the lattice forming quantum well is raised by the use of acoustic waves. Scattering is reduced due to an increase in absorption of phonons at the higher effective temperatures and the overall efficiency of electron emission is increased. Generally, electron emitter 15 operates at approximately room temperature. That is, no heat is added by outside sources, other than that generated by acoustic wave generator 40.

Thus, a new and improved electron emitter is provided which operates on relatively low potentials and at room temperatures. Further, the new and improved electron emitter is not extremely bulky or difficult to manufacture and, therefore, is less expensive in terms of space and fabrication techniques.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A heterostructure electron emitter comprising:

a substrate;

a plurality of layers of semiconductor material deposited on the substrate with a surface layer having a surface barrier potential, the plurality of layers forming a quantum well for the collection of free electrons, each collected electron having an energy level below the surface barrier potential; and an acoustic generator positioned on the substrate to launch acoustic waves into free electrons collected in the quantum well so as to raise the energy level of collected free electrons above the surface barrier potential for the emission of the electrons into free space.

2. A heterostructure electron emitter as claimed in claim 1 wherein the plurality of layers includes a buffer layer positioned on the substrate to provide crystallographic compatibility.

3. A heterostructure electron emitter as claimed in claim 1 wherein the plurality of layers includes a thin layer of semiconductor material with a relatively small bandgap.

4. A heterostructure electron emitter as claimed in claim 3 wherein the thin layer includes a layer of indium gallium arsenide.

5. A heterostructure electron emitter as claimed in claim 3 wherein the plurality of layers includes a layer of gallium arsenide on the thin layer.

6. A heterostructure electron emitter as claimed in claim 5 wherein the plurality of layers includes a cap layer including one of cesium and diamond.

7. A heterostructure electron emitter as claimed in claim 1 including in addition contacts positioned on the substrate for coupling free electrons to the substrate and into the quantum well.

8. A heterostructure electron emitter as claimed in claim 7 wherein the contacts are positioned on the substrate so as to apply an electrical bias across at least one of the plurality of layers of semiconductor material.

9. A heterostructure electron emitter comprising:

a substrate having a surface with a predetermined potential barrier;

a quantum well formed in the substrate adjacent the surface;

contacts positioned on the substrate for coupling free electrons to the substrate and into the quantum well; and an acoustic wave device positioned on the substrate so as to direct acoustic waves to strike the free electrons in the quantum well and excite the free electrons sufficiently to cause the free electrons to overcome the potential barrier and to be emitted from the surface of the substrate.

* * * * *